(12) United States Patent
Ochiai et al.

(10) Patent No.: US 7,359,215 B2
(45) Date of Patent: Apr. 15, 2008

(54) FLEXIBLE DISPLAY DEVICE

(75) Inventors: Takahiro Ochiai, Chiba (JP); Masahiro Tanaka, Chiba (JP); Toshiki Kaneko, Chiba (JP); Yukio Takasaki, Kawasaki (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 136 days.

(21) Appl. No.: 10/964,667

(22) Filed: Oct. 15, 2004

(65) Prior Publication Data

US 2005/0110785 A1 May 26, 2005

(30) Foreign Application Priority Data

Oct. 17, 2003 (JP) ............................. 2003-357882

(51) Int. Cl.
*H01R 12/16* (2006.01)
(52) U.S. Cl. ...................................... 361/789; 174/254
(58) Field of Classification Search ........ 361/174–751, 361/789, 752; 174/254, 255, 256
See application file for complete search history.

(56) References Cited

U.S. PATENT DOCUMENTS

| | | | |
|---|---|---|---|
| 6,885,146 B2 * | 4/2005 | Yamazaki et al. ........... | 313/498 |
| 6,904,155 B2 * | 6/2005 | Yonehara et al. ........... | 381/174 |
| 2003/0071832 A1 * | 4/2003 | Branson ..................... | 345/698 |
| 2003/0134488 A1 * | 7/2003 | Yamazaki et al. .......... | 438/455 |
| 2003/0162312 A1 * | 8/2003 | Takayama et al. ........... | 438/22 |
| 2004/0124763 A1 * | 7/2004 | Nathan et al. ............... | 313/498 |

FOREIGN PATENT DOCUMENTS

| | | |
|---|---|---|
| JP | 10-177894 | 6/1998 |
| JP | 11-87754 | 3/1999 |
| JP | 11-288750 | 10/1999 |
| JP | 2001-210998 | 8/2001 |

* cited by examiner

*Primary Examiner*—Randy W. Gibson
*Assistant Examiner*—Abiy Getachew
(74) *Attorney, Agent, or Firm*—Antonelli, Terry, Stout & Kraus, LLP.

(57) ABSTRACT

A flexible display device includes: a flexible substrate which constitutes at least part of an envelope of the flexible display device; a plurality of pixels disposed on the flexible substrate; a group of terminals which is formed at a first portion on one surface of the flexible substrate and supplies signals to the plurality of pixels; and a reinforcing member attached to at least a second portion on another surface of the flexible substrate which faces the first portion across a thickness of the flexible substrate.

14 Claims, 7 Drawing Sheets

FLEXIBLE DISPLAY DEVICE

CLAIM OF PRIORITY

The present application claims priority from Japanese application serial no. 2003-357882, filed on Oct. 17, 2003, the content of which is hereby incorporated by reference into this application.

BACKGROUND OF THE INVENTION

The present invention relates to a display device, and in particular to a display device having a flexible body.

For example, a display device such as an organic EL (electroluminescent) display device has a plurality of gate signal lines extending in an x direction and arranged in a y direction on one surface of a substrate, a plurality of drain signal lines extending in the y direction and arranged in the x direction on the surface, and a plurality of pixel areas each surrounded by two adjacent ones of the gate signal lines and two adjacent ones of the drain signal lines, and each of the pixel areas is provided at least with a thin film transistor which is turned on by a scanning signal from a corresponding one of the gate signal lines and a light emitting layer (an organic EL layer) which flows therethrough a current corresponding to a video signal supplied via the thin film transistor from a corresponding one of the drain signal lines. Further, since characteristics of the light emitting layer are degraded by its oxidization or moisture, usually the display device is provided with another substrate which shield the light emitting layer from the air, and a desiccant is provided within the space thus shielded from the air.

While some of the substrates are made of glass, for example, others became known recently which are made of resin, for instance. Some of the organic EL display devices have flexible bodies as disclosed in Japanese Patent Application Laid-Open Nos. Hei 11-288,750; 2001-210,998; Hei 11-87,754; and Hei 10-177,894 Publications.

SUMMARY OF THE INVENTION

In display devices having such a configuration, since terminals supplied with signals externally are formed over the flexible substrates, a portion having the terminals thereon are configured so as to be flexible.

The terminals are coupled to a flexible printed wiring board, and are supplied with signals via this flexible printed wiring board. Here, since the portion provided with the terminals is configured so as to be flexible, it is pointed out that defective electrical connections are apt to occur between the terminals and the flexible printed wiring board.

The present invention has been made in view of the above, and an object of the present invention is to provide a display device capable of securing a sufficient connection between the terminals and the flexible printed wiring board without deteriorating the flexibility of the substrate itself.

The following will explain the summary of representative ones of the inventions disclosed in this specification.

In accordance with an embodiment of the present invention there is provided a flexible display device comprising: a flexible substrate which constitutes at least part of an envelope of said flexible display device; a plurality of pixels disposed on said flexible substrate; a group of terminals which is formed at a first portion on one surface of said flexible substrate and supplies signals to said plurality of pixels; and a reinforcing member attached to at least a second portion on another surface of said flexible substrate which faces said first portion across a thickness of said flexible substrate.

In accordance with another embodiment of the present invention there is provided a flexible display device comprising: a flexible substrate which constitutes at least part of an envelope of said flexible display device; a plurality of pixels disposed on said flexible substrate; a group of terminals which is formed at a first portion on one surface of said flexible substrate and supplies signals to said plurality of pixels; a flexible wiring board which is coupled to said group of terminals; and a reinforcing member attached to at least a second portion on another surface of said flexible substrate which faces said first portion across a thickness of said flexible substrate.

In accordance with another embodiment of the present invention there is provided a flexible display device comprising: a flexible substrate which constitutes at least part of an envelope of said flexible display device; a plurality of pixels disposed on said flexible substrate; a group of terminals which is formed at a first portion on one surface of said flexible substrate and supplies signals to said plurality of pixels; a plurality of flexible wiring boards, each of said plurality of flexible wiring boards being coupled to a respective one of a plurality of subgroups obtained by dividing said group of terminals into said plurality of subgroups each comprising plural adjacent ones of said group of terminals; and a plurality of reinforcing members, each of said plurality of reinforcing members being attached to a second portion on another surface of said flexible substrate which faces said first portion across a thickness of said flexible substrate, and said each of said plurality of reinforcing members facing a respective one of said plurality of subgroups.

The present invention is not limited to the above configurations, and various changes and modifications may be made without departing from the spirit and scope of the present invention.

The display device of the above configuration is capable of securing a sufficient connection between the terminals and the flexible printed wiring board, and preventing occurrences of defective electrical connections without deteriorating the flexibility of its substrate itself, even if the substrate is bent.

BRIEF DESCRIPTION OF THE DRAWINGS

In the accompanying drawings, in which like reference numerals designate similar components through out the figures, and in which.

DETAILED DESCRIPTION OF THE PREFERRED EMBODIMENTS

In the following, the embodiments of the display devices in accordance with the present invention will be explained by reference to the drawings.

Figure 7A:
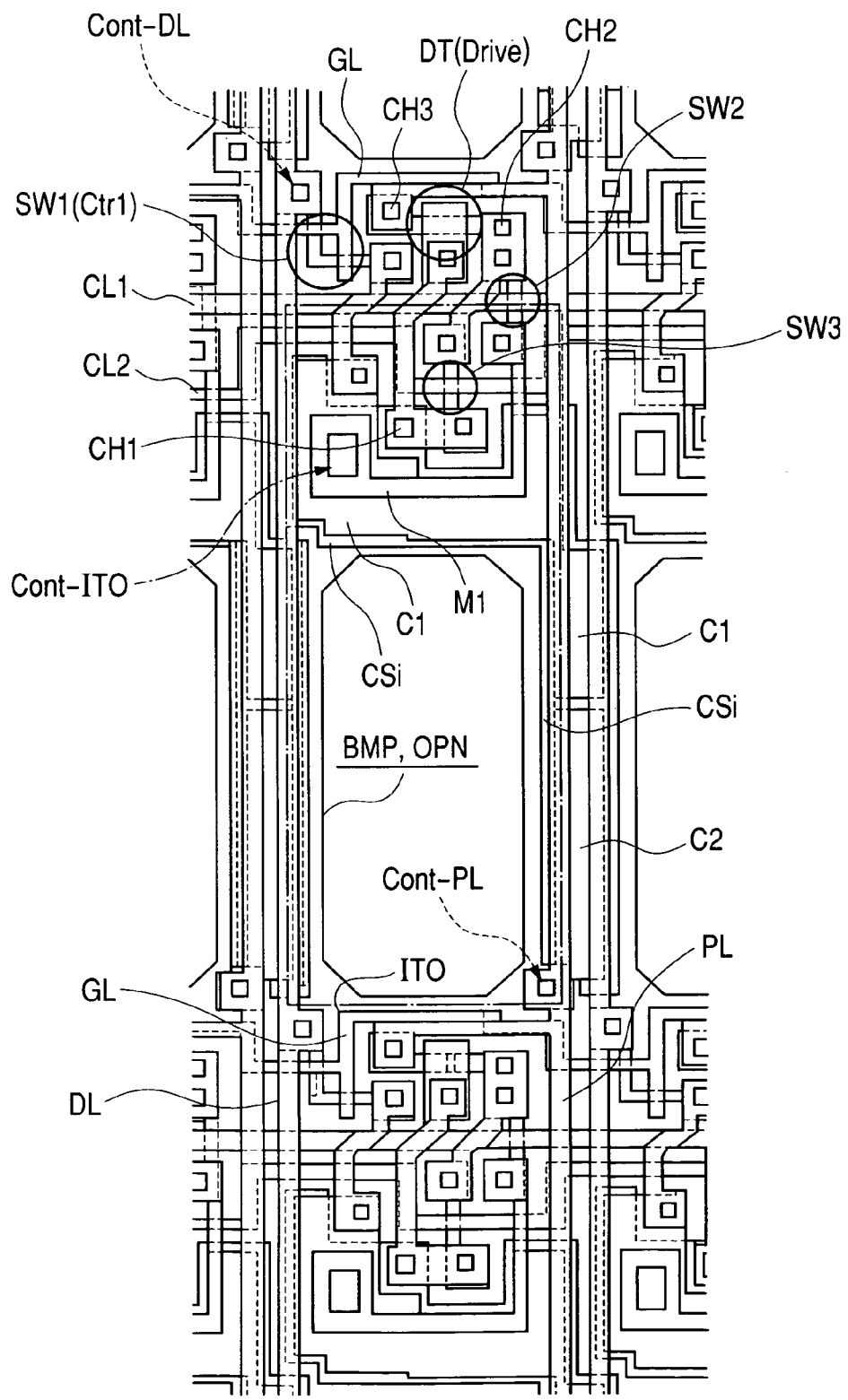
FIG. 7(a) is a fragmentary plan view illustrating a pixel of an example of a display device, for example, an organic EL display device, in accordance with the present invention.

FIG. 7(a) is a plan view illustrating one pixel and its vicinities in an organic EL display device, for example. The pixels of the organic EL display device are formed in a matrix fashion on a surface of a transparent substrate, for example, and one of the pixels is illustrated in FIG. 7(a). In each of the pixels, an electronic circuit having very small details is fabricated by laminating a conductive layer, a semiconductor layer, an insulating layer and others formed in respective desired patterns properly.

In FIG. 7(a), a top border of one pixel is defined by a gate signal line GL for driving the pixel selectively, a left-side border of the pixel is defined by a drain signal line DL for supplying a video signal to the pixel, a right-side border of the pixel is defined by a current supply line PL for supplying a current to the pixel, and a bottom border of the pixel is defined by a gate signal line GL for driving another pixel adjacent to the pixel selectively. The area of the one pixel is divided into upper and lower portions, a light emitting layer formed of an EL layer is formed in the lower portion, and a circuit is formed in the upper portion which generates a current corresponding to the video signal.

Laminated successively from the substrate side in the above-mentioned lower portion of the pixel having the light emitting layer are a first electrode (denoted by ITO in FIG. 7(a)) formed of a light transmissive conductive layer, for example, a light emitting layer, and a second electrode. The light emitting layer is disposed within an opening (denoted by BMP, OPN in FIG. 7(a)) in a bank-forming layer formed on an upper one of the layers over the first electrode, and constitutes a substantial light emitting section. The second electrode also covers a top surface of the bank-forming layer, and is formed for all the pixels in common. The light emitting layer generates light of an intensity corresponding to a current passed therethrough with the first and second electrodes being used as an anode and a cathode, respectively. Here, the banking-forming layer is provided to prevent the light generated in the pixel from being transferred to adjacent pixels, and to form the initially fluid light emitting layer in the desired pattern during the manufacturing process.

Formed in the above-mentioned upper portion of the pixel having the above-mentioned circuit for generating a current corresponding to a video signal are switching elements SW1, SW2 and SW3, a control signal line CL1 for performing ON-OFF control of the switching element SW2, a control signal line CL2 for performing ON-OFF control of the switching element SW3, a drive transistor DT, and capacitance elements C1-CSi and CSi-C2. This circuit accepts a video signal from the drain signal line DL based upon a scanning signal from the gate signal line GL, and supplies a current from the current supply line PL to the first electrode in the lower portion having the light emitting layer correspondingly to the magnitude (voltage) of the video signal. Here, the switching elements SW2, SW3 and the capacitance element CSi-C2 are provided to correct variations in threshold voltage of the drive transistors DT from pixel to pixel if any.

Equivalent Circuit

Figure 7B:
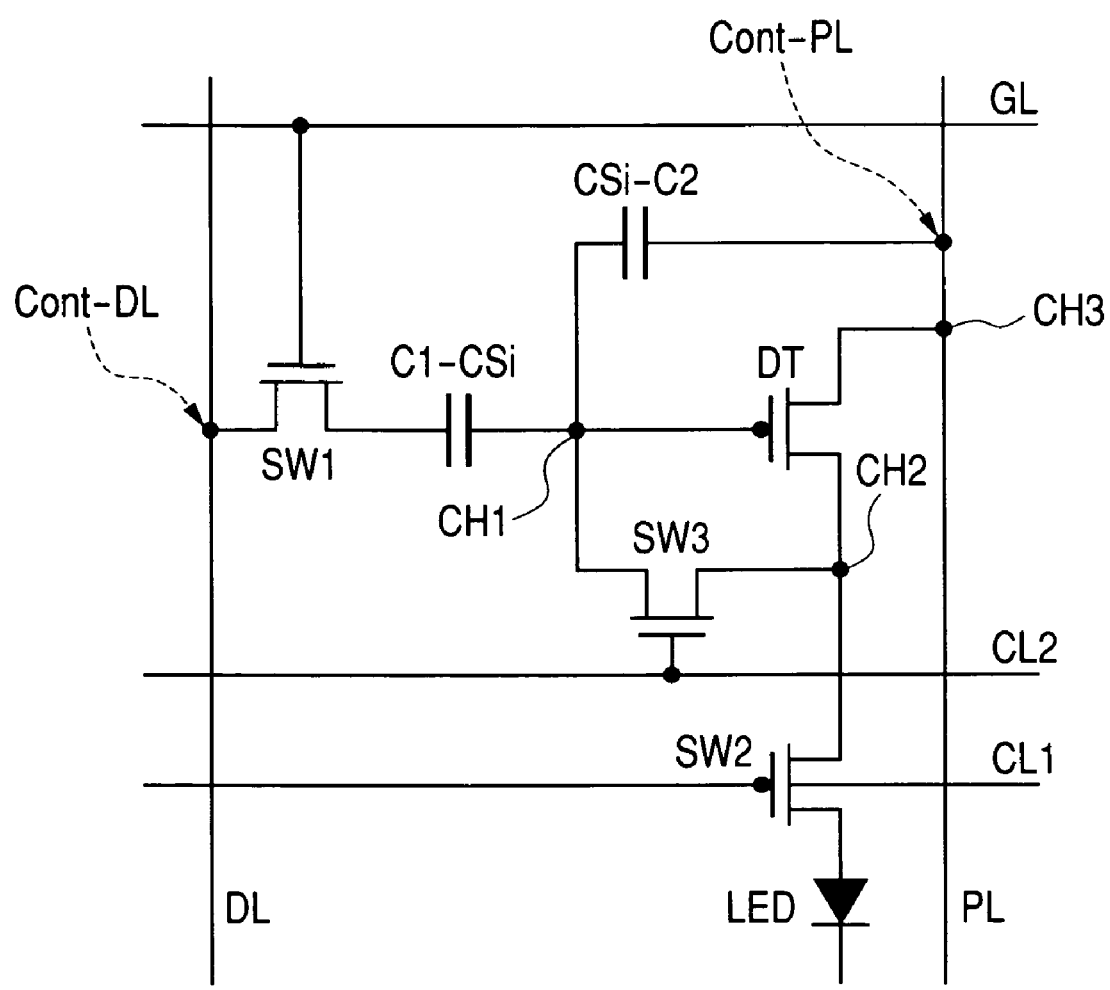
FIG. 7(b) illustrates an equivalent circuit of the pixel illustrated in FIG. 7(a).

FIG. 7(b) illustrates an equivalent circuit of the one pixel explained in connection with FIG. 7(a), which is represented in an arrangement generally geometrically corresponding to that of FIG. 7(a). The switching element SW1 is turned on by a scanning signal from the gate signal line GL, and a video signal from the drain signal line DL is supplied to one electrode C1 of the capacitance element C1-CSi via the switching element SW1, and at this time the other electrode of the capacitance element C1-CSi is in a floating state. The capacitance element C1-CSi has a function of maintaining the gate potential of the drive transistor DT which is equal to that of the other electrode of the capacitance element C1-CSi, at a desired value during a desired period of time.

Under this condition, first the switching element SW2 is turned on by a control signal transferred through the control signal line CL1. At this time, although the drive transistor DT is not turned on, its node CH2 is changed from a floating state, is connected to a reference potential through an organic EL element LED, and thereby is raised to a desired potential.

Next, the switching element SW3 is turned on by a control signal transferred through the control signal line CL2, thereby one electrode CSi of the capacitance element CSi-C2 is changed from a floating state, is connected to the node CH2 of the drive transistor DT via the switching element SW3, and is raised to the above-mentioned desire value. At this time, since the potential (the potential of a node CH1) of the gate of the drive transistor DT is equal to that of its output (the node CH2), a channel layer of the drive transistor DT cuts off the flow of charge.

Since a desired current flows through the current supply line PL regardless of a video signal transferred by the drain signal line DL, its potential is approximately constant. Therefore, by turning on the two switching elements SW2, SW3 successively (making the respective channel layers successively conducting), approximately equal amounts of charges are stored in the capacitance elements CSi-C2 of all pixels.

Under this condition, when the channel layer of the switching element SW3 is closed, then when the switching element SW1 is turned on, a capacitance of the capacitance element C1-CSi varies with a voltage (a video signal) applied to the electrode C1 of the capacitance element C1-CSi, and in accordance with this, a difference in potential is caused between the potential of the node CH1 (the gate potential of the drive transistor DT) and the potential of its output (that of the node CH2). This potential difference turns on the drive transistor DT, and controls the amount of charges flowing through the turned-on channel, and thereby the organic EL element generates light of desired brightness.

Incidentally, in this embodiment, the configuration of the pixel is not limited to the above-described configuration. For example, the correction circuit formed of the switching element SW2, SW3 and the capacitance element CSi-C2 may be omitted, and the bank-forming layer may be omitted.

Plan View of the Whole

Figure 1A:
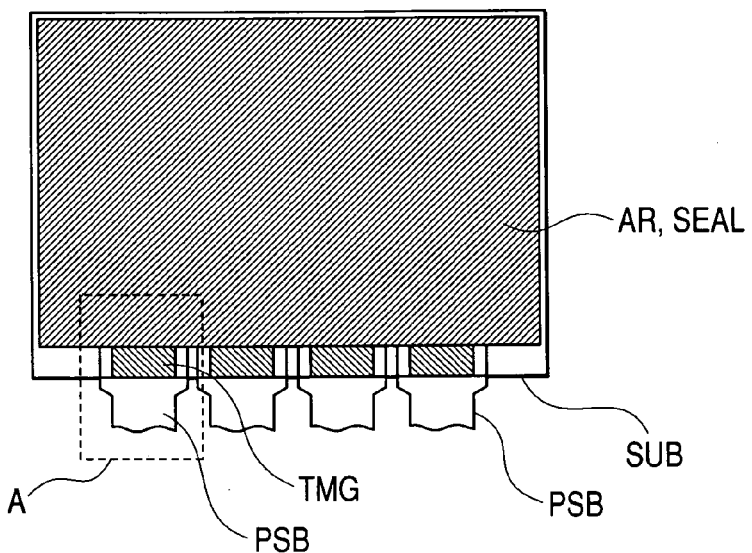
FIG. 1(a) is a plan view illustrating the whole of an example of a display device, for example, an organic EL display device, in accordance with the present invention.

FIG. 1(a) is a plan view illustrating the whole of an organic EL display device provided with a display section having a plurality of pixels arranged in a matrix fashion each of which has the above-described configuration. The display section AR occupies a central region excluding small peripheral portions on the rectangular substrate SUB, and the observer recognizes a video image formed of light generated by the respective pixels in the display section AR.

Here, the substrate SUB is made of a flexible substrate, and is hereinafter referred to as the flexible substrate SUB. This flexible substrate SUB imparts flexibility to the organic EL display device itself. The flexible substrate SUB is made of polyethylene terephthalate, for example. Formed on the flexible substrate SUB is a laminate PIL comprised of a patterned conductive layer, a patterned semiconductor layer, an insulating layer which are different in conductivity from each other. This laminate PIL includes a light emitting layer and a semiconductor layer, and forms the electronic circuit in each of the pixels as shown in FIG. 7(b). As shown in FIG. 1(c), formed on the surface of the laminate PIL are a desiccant agent layer DSC and a sealing agent layer SEAL covering the desiccant agent layer DSC also. Although the laminate PIL and the desiccant agent layer DSC are not shown in FIG. 1(a), the sealing agent layer SEAL is disposed in the display section AR as shown in FIG. 1(a).

Since the light emitting layer is degraded by moisture, the desiccant agent layer DSC is provided to absorb moisture. Therefore, it is desirable that the laminate PIL comprised of the various layers different in conductivity from each other is bonded to the flexible substrate SUB such that the light emitting layer is arranged to be in an upper layer of the laminate PIL, in other words, the light emitting layer is disposed closer to the desiccant agent layer DSC. In the above expression "the laminate PIL is bonded to the flexible substrate SUB," "bonded" is used for the following reason. When the laminate PIL is fabricated on a rigid substrate, a glass substrate, for example, the circuit and others in the laminate PIL are less subject to damage, and therefore usually the laminate PIL is separated from the rigid substrate after the laminate PIL has been completed on the rigid substrate.

With the above configuration, the laminate PIL is shielded from the air by a combination of the flexible substrate SUB and the sealing agent layer SEAL, in other words, the combination of the flexible substrate SUB and the sealing agent layer SEAL forms an envelope of the organic EL display device.

Further, the gate signal lines GL, the drain signal lines DL, the current supply lines PL, the control signal lines CL1, CL2 which have been explained in connection with the configuration of the pixels are brought out to one side of the flexible substrate SUB, and they are connected to corresponding ones of terminals TM at the one side of the flexible substrate SUB.

The terminals TM form a terminal group TMG in which the terminals TM are arranged in a direction of extension of the one side of the flexible substrate SUB, and this terminal group TMG serves as external terminals of the organic EL display device.

The terminal group TMG is adapted to be coupled to the flexible wiring board PSB via an anisotropic conductive film, and the organic EL display device is supplied with various kinds of signals through the flexible wiring board PSB. In the configuration illustrated in FIG. 1(a), a plurality of flexible wiring boards PSB are arranged, and each of the flexible wiring boards PSB is assigned and connected to plural adjacent terminals TM in the terminal group TMG. Here, the flexible wiring board PSB has a configuration of a wiring layer being on a flexible substrate which is made of polyimide, for example.

Incidentally, in this example, the sealing agent layer SEAL is formed over the display section AR via the desiccant agent layer DSC, but the present invention is not limited to this configuration, and it is needless to say that a flexible substrate can be used in place of the sealing agent layer SEAL.

EXAMPLE 1

Figure 1B:
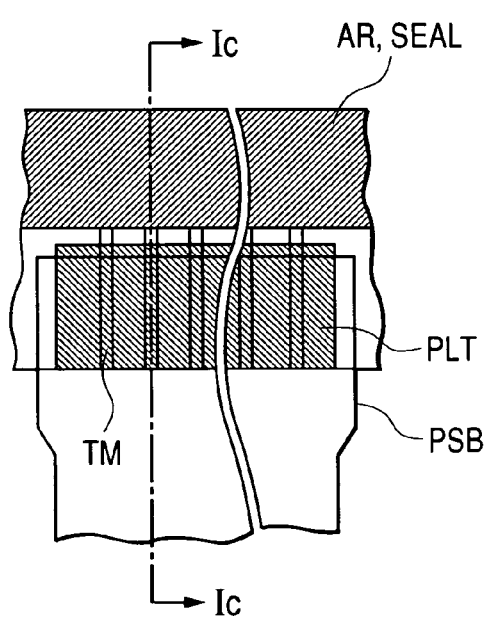
FIG. 1(b) is an enlarged plan view of an area A enclosed by broken lines in FIG. 1(a)
Figure 1C:
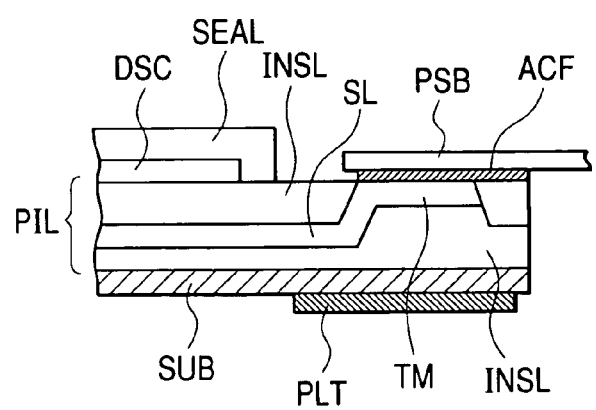
FIG. 1(c) is a cross-sectional view of FIG. 1(b) taken along line IC-IC.

FIG. 1(b) is an enlarged plan view of an area A enclosed by broken lines in FIG. 1(a), and shows that one of the flexible wiring boards PSB is coupled to plural adjacent terminals TM of the terminal group TMG. FIG. 1(c) is a cross-sectional view of FIG. 1(b) taken along line IC-IC. In FIG. 1(c), on the flexible substrate SUB is the electronic circuits for the respective pixels formed by the laminate PIL comprised of a patterned conductive layer, a patterned semiconductor layer, an insulating layer and others which are different in conductivity from each other, and the top surface of the electronic circuits are covered with the sealing agent layer SEAL with the desiccant agent layer DSC interposed therebetween.

In this specification, the laminate PIL means a laminate comprised of at least two layers of the conductive layer, the semiconductor layer and the insulating layers.

A signal line SL lying in a lower layer of the laminate PIL viewed from its surface is brought out to the surface of the laminate PIL via a through hole formed in the vicinity of a region formed with a corresponding terminal, and an extension of the brought-out signal line forms the above-explained terminal TM. The terminal group TMG formed of the terminals TM is coupled to the flexible wiring board PSB via the anisotropic conductive film ACF.

In this specification, the laminate PIL formed in the region formed with the terminals is intended to mean a laminate comprised of a conductive layer forming a signal line SL and at least one insulating layer INSL.

In this example, a reinforcing plate member PLT is attached to a surface of the flexible substrate SUB opposing a region where plural adjacent terminals TM of the terminal group TMG are formed which are to be coupled to one of the flexible wiring boards PSB. This reinforcing plate member PLT is made of polycarbonate, for example. This reinforcing plate member PLT is made of a material having stiffness higher than that of the flexible substrate SUB, that is to say, the reinforcing plate member PLT is configured so as to impart higher stiffness to the region of the flexible substrate SUB where the plural adjacent terminals TM are formed, than the remainder of the flexible substrate SUB.

With this configuration, even when the organic EL display device which uses the flexible substrate SUB as one constituent member of its envelope is assembled in the form of being easily bent, the amount of the bending can be made comparatively small in the region of the flexible substrate SUB where the plural adjacent terminals TM are formed, and consequently, the flexible wiring board PSB can be prevented from being accidentally disconnected from the terminals TM.

Further in this example, for each of the regions of the flexible substrate SUB where the plural adjacent terminals TM of the terminal group TMG are formed, in other words, for each of the regions where the plural adjacent terminals TM coupled to a corresponding one of the flexible wiring boards PSB are formed, one of the reinforcing plate members PLT is provided. Therefore, a small spacing is provided between adjacent ones of the reinforcing plate members PLT, and consequently, since the organic EL display device can be bent arcuately in a plane perpendicular to a direction of extension of the terminals TM, the organic EL display device is not prevented greatly from being bent freely.

EXAMPLE 2

Figure 2:
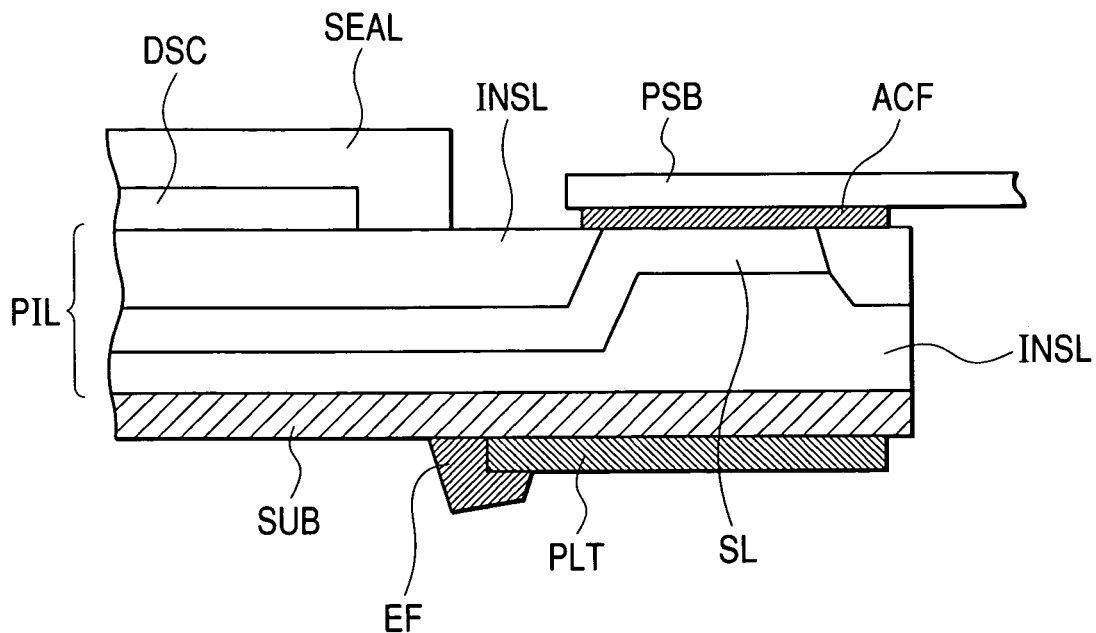
FIG. 2 is a fragmentary cross-sectional view illustrating a terminal portion of another example of a display device, for example, an organic EL display device, in accordance with the present invention.

FIG. 2 is a cross-sectional view similar to that of FIG. 1(c), illustrating another example of a terminal portion of the organic EL display device in accordance with the present invention. This example is different from that illustrated in FIG. 1(c), in that the terminal portion employing the reinforcing plate member PLT having the configuration illustrated in FIG. 1(c) has the reinforcing agent EF attached at a periphery of the reinforcing plate member PLT. The reinforcing agent EF is made of epoxy resin, for example. The reinforcing agent EF is provided to prevent the possibility that peeling-off starts easily at an interface between the comparatively easily bendable flexible substrate SUB and the comparatively less-bendable reinforcing plate member PLT from the periphery of the reinforcing plate member PLT when the organic EL display device is bent. Therefore it is desirable to provide the reinforcing agents EF at three sides of the rectangular reinforcing plate member PLT excluding one side of the reinforcing plate member PLT disposed close to the periphery of the flexible substrate SUB. However, it is needless to say that it is effective to provide the reinforcing agent EF at only one side of the reinforcing plate member PLT facing toward the central area of the organic EL display device, that is, only the sides of the reinforcing plate member PLT other than the sides parallel with the direction of extension of the terminals TM of the terminal group TMG. Here, the reinforcing agent EF is applied to extend desired distances on both the reinforcing plate member PLT and the flexible substrate SUB including the border area between the corresponding side of the reinforcing plate member PLT and the flexible substrate SUB.

EXAMPLE 3

Figure 3:
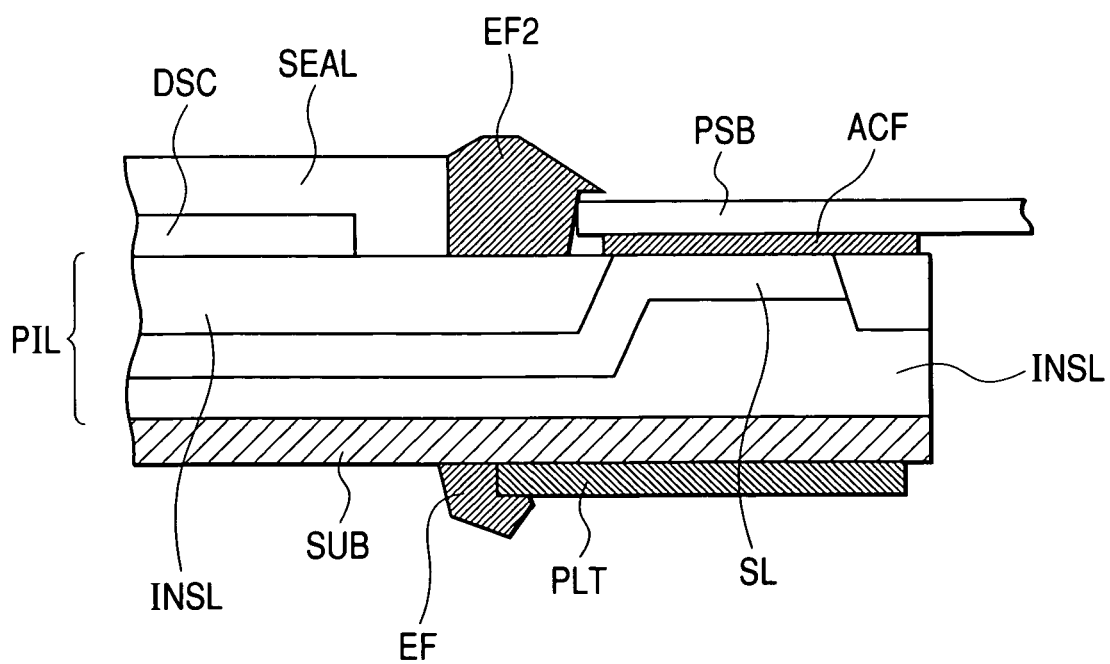
FIG. 3 is a fragmentary cross-sectional view illustrating a terminal portion of another example of a display device, for example, an organic EL display device, in accordance with the present invention.

FIG. 3 is a cross-sectional view similar to that of FIG. 2, illustrating another example of a terminal portion of the organic EL display device in accordance with the present invention. This example is different from that illustrated in FIG. 2, in that the reinforcements between the flexible wiring board PSB and the laminate PIL, and between the flexible wiring board PSB and the sealing agent layer SEAL are provided in addition to the reinforcement between the reinforcing plate member PLT and the flexible sustrate SUB. That is to say, since the reinforcing plate member PLT is provided to prevent peeling-off of the flexible wiring board PSB, the expedient for prevention of peeling-off of the flexible wiring board PSB itself.

In the region where the flexible wiring boards PSB are coupled to the terminals TM, it is desirable to provide spacings between adjacent ones of the flexible wiring boards PSB, and between the flexible wiring boards PSB and the sealing agent layer SEAL, and to apply second reinforcing agents EF2 in these spacings. However, also in this case, as in the case of the reinforcing agent EF for reinforcing the reinforcing plate member PLT, the second reinforcing agent EF2 may be applied only between the flexible wiring board PSB and the sealing agent layer SEAL, as shown in FIG. 3.

EXAMPLE 4

Figure 4:
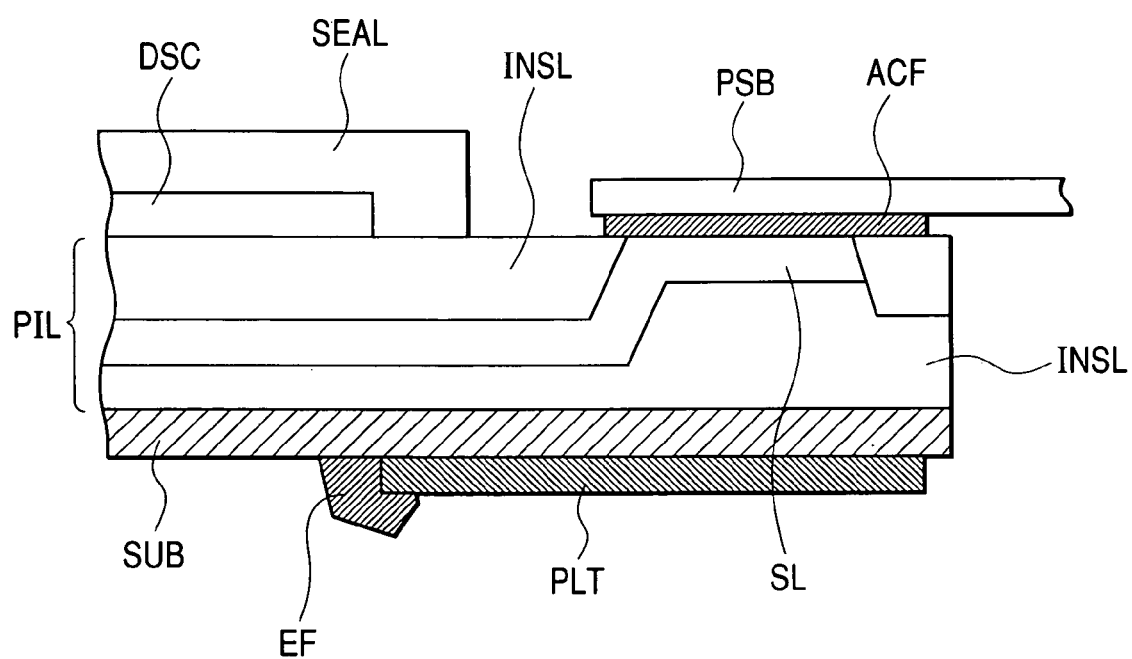
FIG. 4 is a fragmentary cross-sectional view illustrating a terminal portion of an example of a display device, for example, an organic EL display device, in accordance with the present invention.

FIG. 4 is a cross-sectional view similar to that of FIG. 2, illustrating another example of a terminal portion of the organic EL display device in accordance with the present invention. This example is different from that illustrated in FIG. 2, in that the reinforcing plate member PLT attached to the flexible substrate SUB is somewhat larger in area than a region of the flexible substrate SUB in which the terminals TM of the terminal group TMG are formed, and which includes all of the plural terminals TM, in other words, the reinforcing plate member PLT covers an area larger than and extending outwardly from the region. In the case of the example illustrated in FIG. 4, the reinforcing plate member PLT is formed to extend in the direction of extension of the terminals TM as far as it can oppose sufficiently an area where the sealing agent layer SEAL is formed.

EXAMPLE 5

Figure 5A:
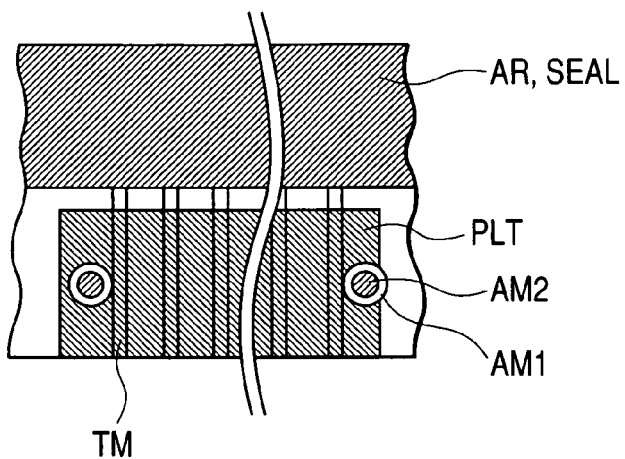
FIG. 5(a) is a fragmentary plan view illustrating a terminal portion of another example of a display device, for example, an organic EL display device, in accordance with the present invention.
Figure 5B:
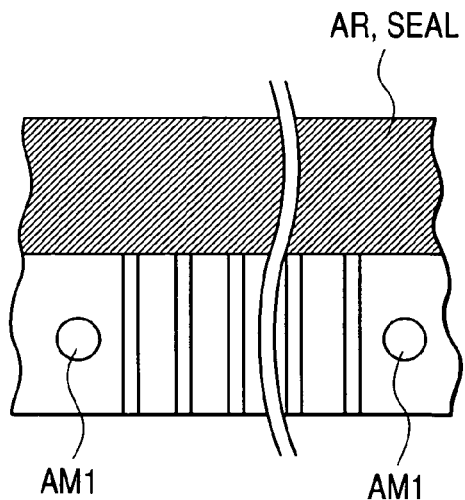
FIG. 5(b) illustrates first alignment marks AM1 formed in a flexible substrate of FIG. 5(a)

FIG. 5(a) is a plan view similar to that of FIG. 1(b), illustrating another example of a terminal potion of the organic EL display device in accordance with the present invention. This example is different from that illustrated in FIG. 1(b), in that the flexible substrate SUB is formed with first alignment marks AM1 on its surface to which the reinforcing plate member PLT is attached, and the reinforcing plate member PLT is formed with second alignment marks AM2 to be aligned with the first alignment marks AM1. FIG. 5(b) illustrates the first alignment marks AM1 formed in the flexible substrate SUB, and FIG. 5(c) illustrates the second alignment marks AM2 formed in the reinforcing plate member PLT to be attached to the flexible substrate SUB.

With this configuration, the reinforcing plate member PLT can be attached to the flexible substrate SUB with good accuracy with respect to the plural mutually adjacent terminals TM, and consequently, peeling-off of the flexible wiring board PSB from the terminals TM can be prevented reliably.

Therefore the first alignment marks AM1 formed in the flexible substrate SUB can be configured so as to function as alignment marks for aligning the laminate PIL formed with the terminals TM.

Figure 5C:
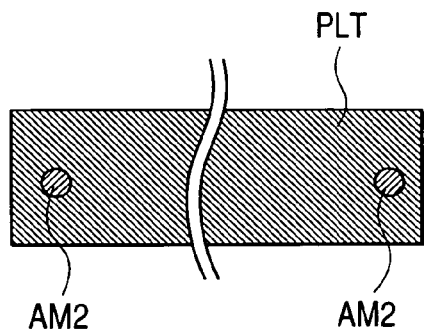
FIG. 5(c) illustrates second alignment marks AM2 formed in a reinforcing plate member of FIG. 5(a)

Further, since the first alignment mark AM1 and the second alignment mark AM2 are marks for positioning in two dimensions including the rotational orientation, they are two in number as illustrated in FIGS. 5(a) to 5(c). It is needless to say that more than two of the alignment marks may be provided.

EXAMPLE 6

Figure 6A:
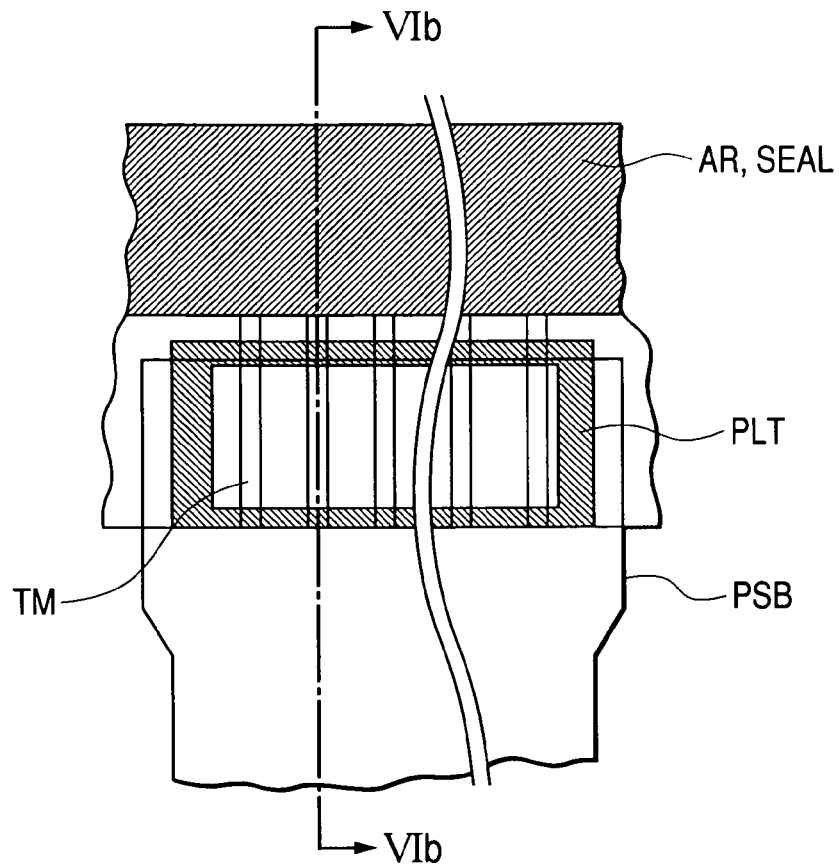
FIG. 6(a) is fragmentary plan view illustrating a terminal portion of another example of a display device, for example, an organic EL display device, in accordance with the present invention.
Figure 6B:
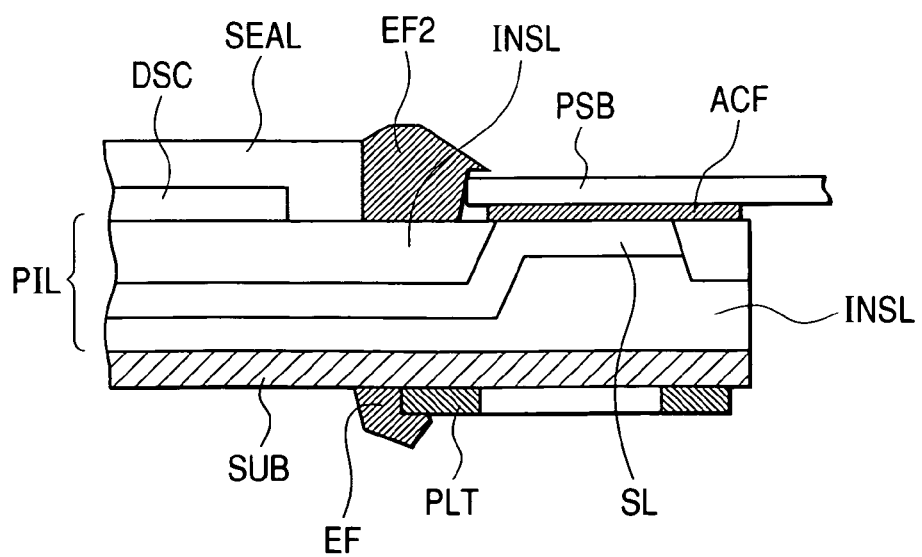
FIG. 6(b) is a cross-sectional view of the terminal portion of FIG. 6(a) taken along line VIb-VIb of FIG. 6(a)

FIG. 6(a) is a plan view similar to that of FIG. 1(b), illustrating another example of a terminal portion of the organic EL display device in accordance with the present invention, and FIG. 6(b) is a cross-sectional view of the terminal portion of FIG. 6(a) taken along line VIb-VIb of FIG. 6(a). This example is different from that illustrated in FIG. 1(b), in that a reinforcing plate member PLT attached to the flexible substrate SUB is not of the shape of a flat plate, but is of the shape of a window frame having an opening formed in its central portion. In the organic EL display device, the reinforcing plate member PLT is not necessarily restricted by its shape for the purpose of imparting higher stiffness to a region of the flexible substrate SUB where the terminals TM are formed, than the remainder of the flexible substrate SUB.

Further, although the reinforcing agent EF is applied between the flexible wiring board PSB and the sealing agent layer SEAL in this example, unlike the example illustrated in FIG. 1(c), it is needless to say that it is not always necessary to apply the reinforcing agent EF.

Further, in this example, for the purpose of increasing the adhesive strength between the window-frame-like reinforcing plate member PLT and the flexible substrate SUB, the reinforcing agent EF is attached to the outer periphery of the reinforcing plate member PLT, and it is needless to say that the reinforcing agent EF may also be attached to the inner wall of the opening in the reinforcing plate member PLT for the purpose of ensuring the prevention of the peeling-off of the reinforcing plate member PLT from the flexible substrate SUB.

The opening formed in a central portion of the reinforcing plate member PLT does not need to be empty, but it is needless to say that the opening may be filled with a member weaker in stiffness than the surrounding member.

Although the above examples have been explained in connection with the organic EL display device, it is needless to say that the above examples are applicable to other display devices such as liquid crystal display devices. In the case of the liquid crystal display devices, an envelope is formed by a pair of flexible substrates opposing each other with a liquid crystal layer interposed therebetween, and formed on an upper surface of one of the flexible substrates are terminals for bringing out signal lines from electronic circuits formed on a liquid crystal side surface of the flexible substrate. Thus the circumstances are the very same in both the display devices.

The above examples can be carried out singly or in combination, because the examples provide the respective advantages and a combination of selected ones from the above examples also provides the synergetic advantages.

What is claimed is:

1. A flexible display device comprising:
   a flexible substrate which constitutes at least part of an envelope of said flexible display device;
   a plurality of pixels disposed on said flexible substrate;
   a group of terminals which is formed at a first portion on an upper surface of said flexible substrate and supplies signals to said plurality of pixels;
   a flexible wiring board which is directly coupled to said group of terminals at said first portion on said upper surface of said flexible substrate; and
   a reinforcing member attached to at least a second portion on a lower surface of said flexible substrate which faces said first portion across a thickness of said flexible substrate.

2. A flexible display device according to claim 1, further comprising a reinforcing agent layer, wherein said reinforcing agent layer is disposed to extend over a layer forming said group of terminals and at least a portion of said flexible wiring board, and said reinforcing agent layer covers a portion of a border area between said layer forming said group of terminals and a portion of one edge of said flexible wiring board.

3. A flexible display device according to claim 1, further comprising a reinforcing agent layer, wherein said reinforcing agent layer is disposed to extend over said flexible substrate and at least a portion of said reinforcing member, and said reinforcing agent layer covers a portion of a border area between said flexible substrate and a portion of one edge of said reinforcing member.

4. A flexible display device comprising:
   a flexible substrate which constitutes at least part of an envelope of said flexible display device;
   a plurality of pixels disposed on said flexible substrate;
   a group of terminals which is formed at a first portion on an upper surface of said flexible substrate and supplies signals to said plurality of pixels;
   a plurality of flexible wiring boards, each of said plurality of flexible wiring boards being directly coupled to a respective one of a plurality of subgroups at said first portion on said upper surface of said flexible substrate, said plurality of subgroups being obtained by dividing said group of terminals into said plurality of subgroups each comprising plural adjacent ones of said group of terminals: and
   a plurality of reinforcing members, each of said plurality of reinforcing members being attached to a second portion on a lower surface of said flexible substrate which faces said first portion across a thickness of said flexible substrate, and said each of said plurality of reinforcing members facing a respective one of said plurality of subgroups.

5. A flexible display device according to claim 4, further comprising an anisotropic conductive layer and a reinforcing agent layer, wherein said plurality of flexible wiring boards are coupled to said group of terminals via said anisotropic conductive layer, and said reinforcing agent layer is disposed to extend over a layer forming said group of terminals and at least a portion of said flexible wiring board, and said reinforcing agent layer covers a portion of a border area between said layer forming said group of terminals and a portion of one edge of said flexible wiring board.

6. A flexible display device according to claim 4, further comprising a reinforcing agent layer, wherein said reinforcing agent layer is disposed to extend over said flexible substrate and at least a portion of said reinforcing member, and said reinforcing agent layer covers a portion of a border area between said flexible substrate and a portion of one edge of said reinforcing member.

7. A flexible display device according to claim 1, wherein said flexible substrate and said reinforcing member are formed with first and second alignment marks, respectively, and said reinforcing member is attached to said flexible substrate with said first alignment marks aligned with said second alignment marks.

8. A flexible display device according to claim 4, wherein said flexible substrate and said reinforcing members are formed with first and second alignment marks, respectively, and said reinforcing members are attached to said flexible substrate with said first alignment marks aligned with said second alignment marks.

9. A flexible display device according to claim 1, wherein said reinforcing member has a plate-like shape.

10. A flexible display device according to claim 4, wherein said reinforcing members have a plate-like shape.

11. A flexible display device according to claim 1, wherein said reinforcing member has a window-frame-like shape.

12. A flexible display device according to claim 4, wherein said reinforcing members have a window-frame-like shape.

13. A flexible display device according to claim 1, wherein said reinforcing member is made of resin.

14. A flexible display device according to claim 4, wherein said reinforcing members are made of resin.

* * * * *